United States Patent [19]

Love

[11] Patent Number: 5,023,843
[45] Date of Patent: Jun. 11, 1991

[54] BONDING PAD PROGRAMMABLE INTEGRATED CIRCUIT

[75] Inventor: Andrew M. Love, Stafford, Tex.

[73] Assignee: Texas Instruments Incorporated, Dallas, Tex.

[21] Appl. No.: 263,590

[22] Filed: Oct. 27, 1988

[51] Int. Cl.$^5$ ............................................. G11C 7/02
[52] U.S. Cl. .............................. 365/222; 365/189.11; 365/230.01; 365/233.5
[58] Field of Search ............... 365/189.11, 233.5, 201, 365/222, 230.01

[56] References Cited

U.S. PATENT DOCUMENTS 4,617,651 10/1986 Ip et al. .......................... 365/189.11

Primary Examiner—James W. Moffitt
Attorney, Agent, or Firm—Ronald O. Neerings; Thomas W. DeMond; Melvin Sharp

[57] ABSTRACT

The described embodiments of the present invention provide a circuit and method for programming the mode options of an integrated circuit. The embodiment described provides this function for a dynamic random access memory but is applicable to any integrated circuit. The integrated circuit includes programming bonding pads which are either connected to a selected reference potential or left unconnected. Circuitry on the integrated circuit determines whether the pad is connected to the reference potential or is unconnected, and provides logical signals on the integrated circuit which select the operational mode of the integrated circuit. An additional feature of the described embodiment is a continuous checking to determine if the appropriate connected or unconnected state is being detected. This feature prevents stray fields and other erroneous signals from altering the mode operation of the integrated circuit.

31 Claims, 4 Drawing Sheets

5,023,843

BONDING PAD PROGRAMMABLE INTEGRATED CIRCUIT

FIELD OF THE INVENTION

The present invention relates to the field of integrated circuit design. More specifically, the present invention relates to techniques for providing integrated circuits having several different modes of operation using a fundamental design and programming the integrated circuit at a late manufacturing stage.

BACKGROUND OF THE INVENTION

To be responsive to customers' needs, integrated circuit manufacturers strive to have a wide variety of integrated circuit types to satisfy their customers' needs. Many of these different types are minor modifications of chips that are fundamentally similar. An example of that is the different mode types of dynamic random access memories (DRAMS) which are provided. Some examples of different modes of operations are providing 1-bit output data, 4-bit output data, 8-bit output data, static column and page modes. Each of these modes may help the performance of a system in its own particular way. However, fundamentally each provides the function of storing a set amount of data.

In order to expedite design time and minimize manufacturing costs, integrated circuit manufacturers have designed several mode types into a fundamental design. Some of these multiple design integrated circuits are programmed by providing different metal configurations in the last metalization step. The photomasking for this metalization step may be easily changed in the production line or partially finished integrated circuits may be stored in order to quickly perform the final masking step and quickly provide the desired integrated circuit to the customer. This has been an effective strategy in the industry, but still requires changes to be made in the relatively complicated metalization masking step of the integrated circuit fabrication process. In addition, until the final protective layers are placed over the top of the integrated circuit, the integrated circuit remains very vulnerable to contamination.

Another method devised for providing multiple mode functions is the provision of a pin of the integrated circuit to alter the mode of the integrated circuit depending on the signal provided to that pin. Thus a logical 1 or 0 placed on the mode pin or pins effects the appropriate functional operation. This concept has been carried one step further by obtaining the signal inside of the integrated circuit package by bonding the mode selection bonding pads directly to the appropriate one of a positive voltage supply for logical 1 or ground for a logical 0. This bond programability provides a better solution than changing the metalization by moving the programming step downstream from the integrated circuit manufacturing process to the packaging step. However, each bond pad must be properly connected providing undue complexity in the packaging stage.

SUMMARY OF THE INVENTION

The described embodiments of the present invention provide a circuit and method for programming the mode options of an integrated circuit. The embodiment described provides this function for a dynamic random access memory but is applicable to any integrated circuit. The integrated circuit includes programming bonding pads which are either connected to a selected reference potential or left unconnected. Programming mode circuitry on the integrated circuit determines whether the pad is connected to the reference potential or is unconnected and provides logical signals on the integrated circuit that select the operational mode of the integrated circuit. An additional feature of the described embodiment is a continuous repetitive checking to determine if the appropriate connected or unconnected state is being detected or to refresh the sensing of the programmed state. This feature prevents stray fields and other erroneous signals from altering the mode operation of the integrated circuit.

BRIEF DESCRIPTION OF THE DRAWINGS

The present invention is best understood with regard to the embodiments described in the following detailed description of the preferred embodiments and in conjunction with the drawings wherein.

DETAILED DESCRIPTION

Figure 1:
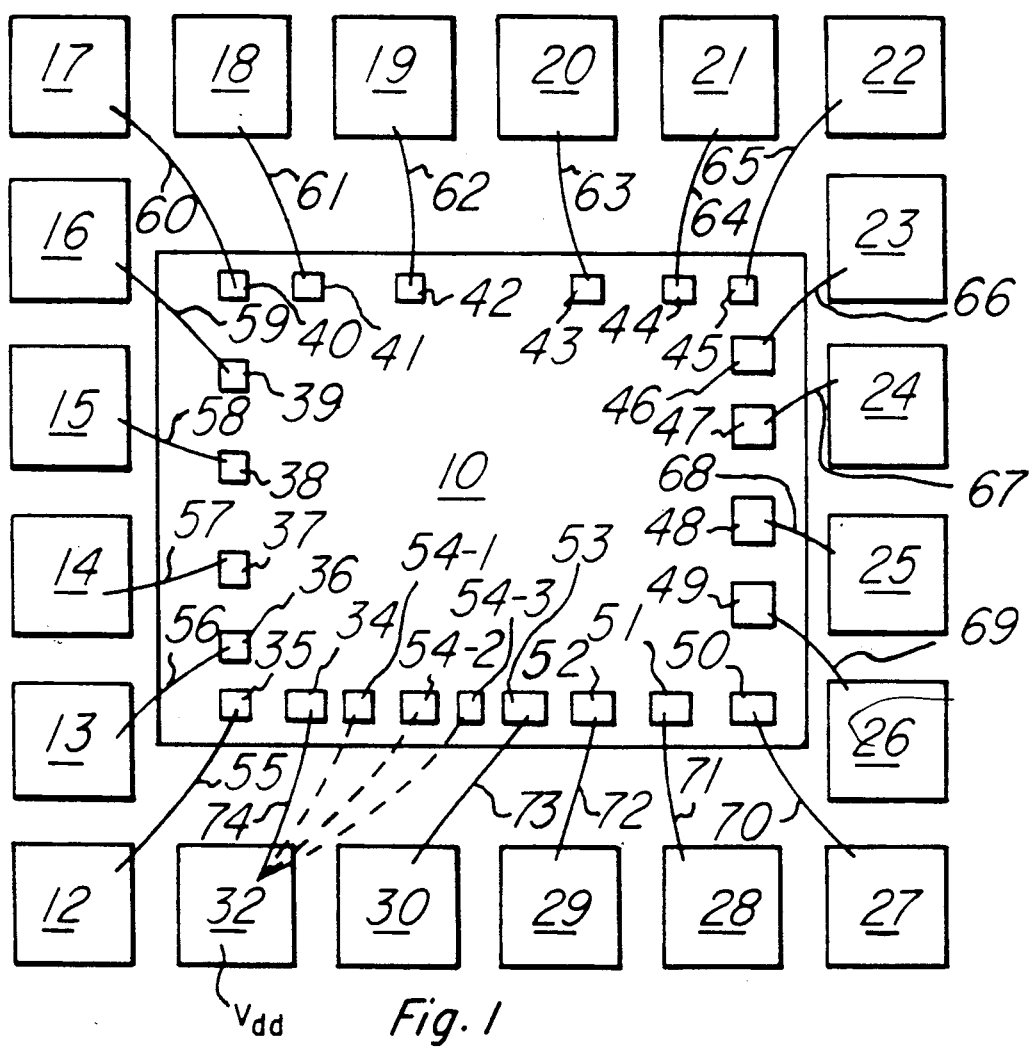
FIG. 1 is a schematic diagram showing an integrated circuit situated in a lead frame with its bond pads schematically connected to the lead pads of the lead frame.
Figure 2:
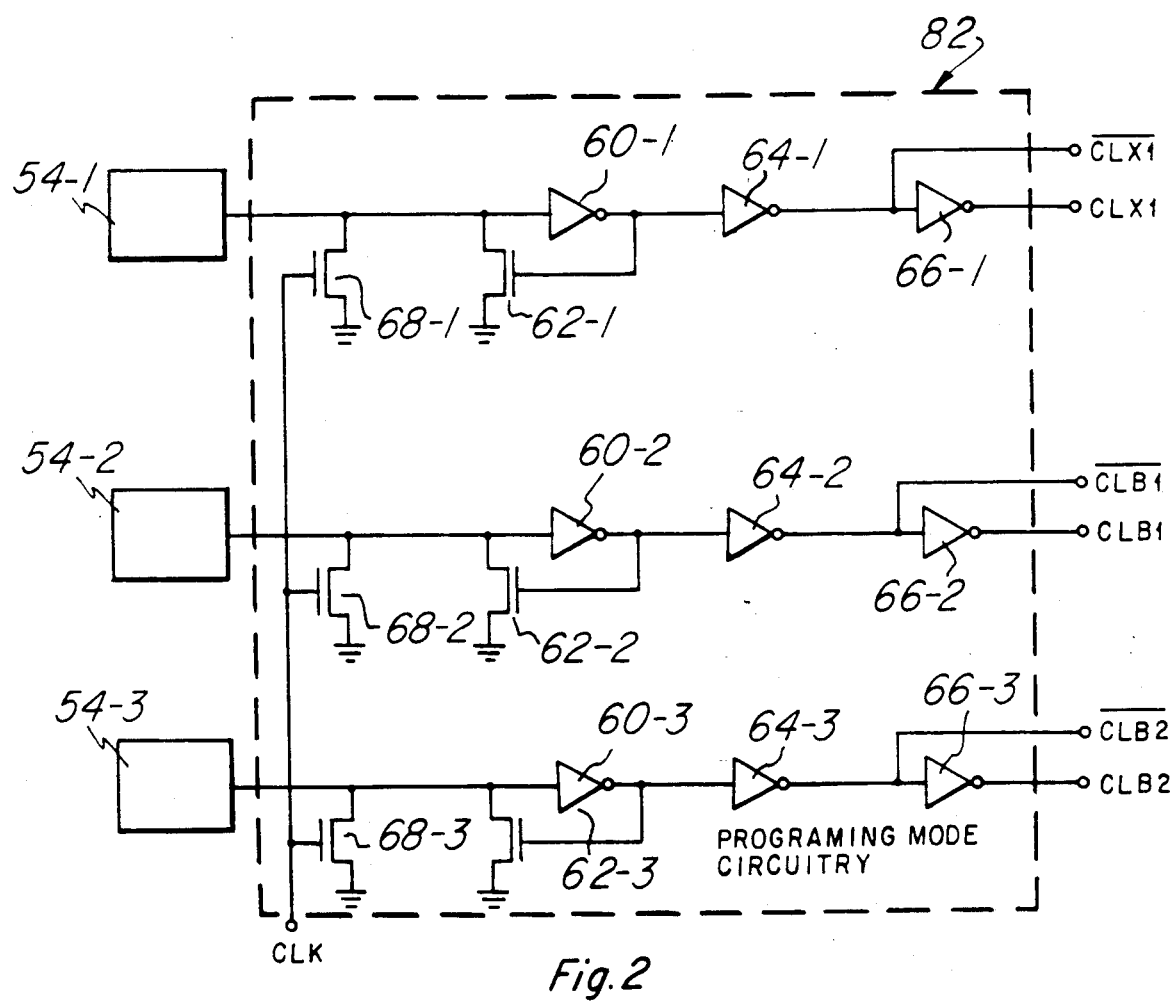
FIG. 2 is a schematic diagram showing the programming mode circuitry on the integrated circuit connected to the programming bond pads.
Figure 3:
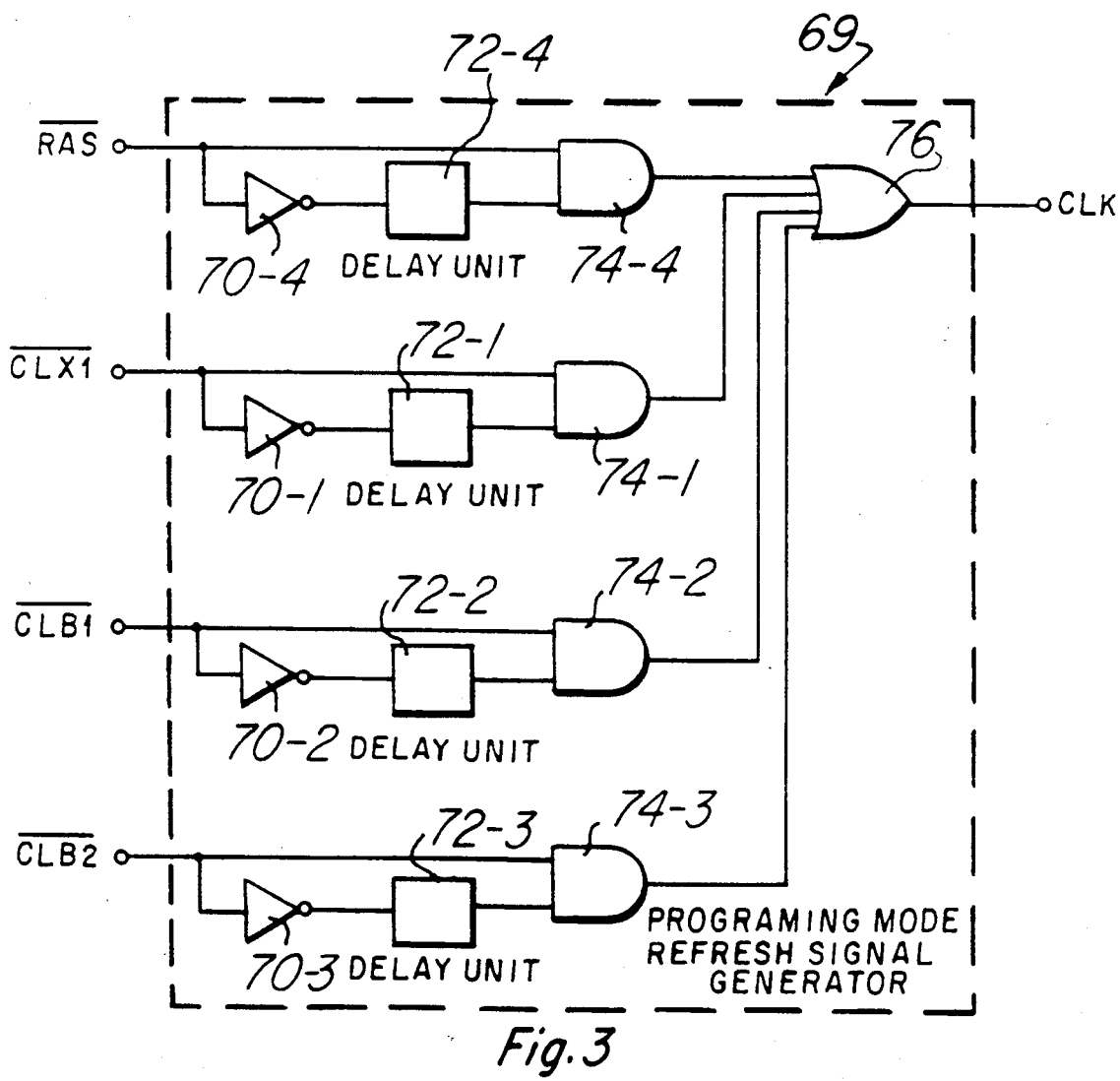
FIG. 3 is a logic diagram describing the circuitry used to generate the refresh signal.
Figure 4:
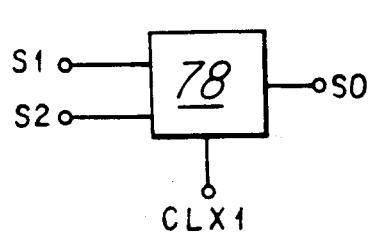
FIG. 4 is a block diagram showing the use of the programming signal to select between two signals to be provided on the integrated circuit.
Figure 5:
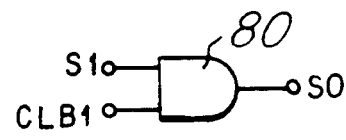
FIG. 5 is a logic diagram showing an AND gate providing a pass through function for a programmed signal on the integrated circuit.
Figure 6:
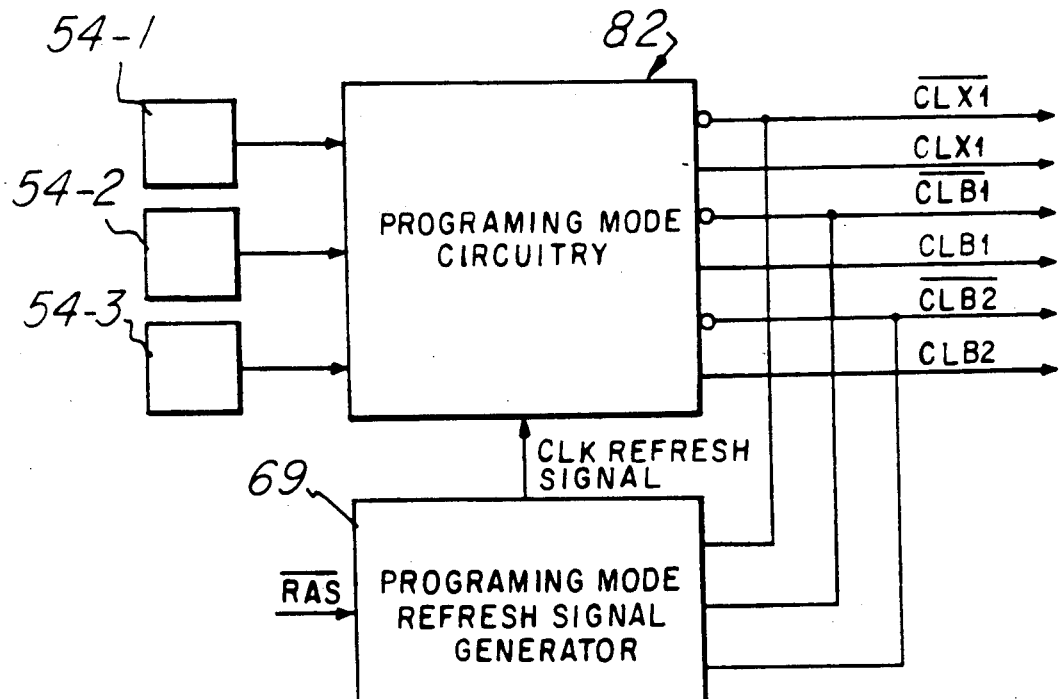
FIG. 6 is a block diagram of the preferred embodiment of the invention.

The described embodiment of the present invention is a dynamic random access memory using three bond pads to provide programability with respect to the mode of operation of the dynamic random access memory. The choice of a dynamic random access memory is provided for exemplary purposes only and is not to be construed as limiting the invention to use in DRAMS, random access memories or memories at all. The present invention is equally applicable to any integrated circuit to provide mode programability at a late stage of manufacturing. The described embodiment is described with regard to FIGS. 1-6. FIG. 1 is a schematic diagram showing the bonding lead pads of a lead frame surrounding an integrated circuit with bonding wires schematically indicated from the lead pads of the lead frame to bonding pads on the integrated circuit. FIG. 2 is a schematic diagram showing the programming mode circuitry on the integrated circuit connected to the programming bond pads. FIG. 3 is a schematic logic diagram showing a programming mode refresh signal generator. FIG. 4 is a block diagram of a multiplexer indicating how a signal from the programming circuitry can select one signal or another. FIG. 5 is a logic diagram showing the use of an AND gate to determine whether a signal is provided or not. FIG. 6 depicts a block diagram of the preferred embodiment.

FIG. 1 is a schematic diagram showing the positioning of an integrated circuit 10 between the lead frame lead pads 12-32 including $V_{dd}$ lead pad 32. These lead pads are connected to bond pads 34 through 53 and programming bond pads 54-1, 54-2, and 54-3 by bonding wires 55 through 74. The signals provided to bond pads 34 through 53 are the normal signals utilized in an integrated circuit of the type of integrated circuit 10. In this example, integrated circuit 10 is a dynamic random access memory and signals such as address signals, data output signals, row address strobe and column address strobe are provided via these bond pads. Bond pads 54-1, 54-2, and 54-3 are selectively connected to lead pad 32 depending upon the selected programmable mode configuration of the integrated circuit thus provided. The programmable mode circuitry connected to bond pads 54-1, 54-2, and 54-3 is designed to detect whether $V_{dd}$ is connected to those bond pads. $V_{dd}$ is selected as an arbitrary reference voltage and another reference voltage such as $V_{ss}$ may be suitably used. After mounting the integrated circuit onto the lead frame and placing the bond wires, the entire assembly is encapsulated in plastic (not shown) by injection molding excepting the ends of the lead frame, which form the lead pins for connection to the circuit board (not shown). In a preferred embodiment, these lead pins form two in-line rows. This is known in the industry as a "dual in-line package" and is a standard package. Of course, many other types of packages may be suitably used such as ceramic packaging or surface mounting techniques.

FIGS. 2 and 6 are schematic diagrams showing the programming mode circuitry 82 connected to bond pads 54-1 through 54-3. When $V_{dd}$ is connected to bond pad 54-1, the high voltage signal is inverted once by inverter 60-1 which provides a low signal to the gate of transistor 62-1. Thus transistor 62-1 does not pull the input terminal of inverter 60-1 to ground. The low voltage signal provided by inverter 60-1 is inverted again by inverter 64-1 which provides a logical 1 (high voltage) output complementary signal as signal $\overline{CLX1}$. This signal is inverted once again by inverter 66-1 to provide true signal CLX1. When bond pad 54-1 is not connected, an initializing or refreshing high voltage signal is provided as input refresh signal CLK (this signal occurs on power up by the transition of the row address strobe ($\overline{RAS}$) signal, which is provided to the CLK refresh signal generating circuit as described below) which causes refresh transistor 68-1 to conduct in a source to drain path to ground. The CLK refresh signal appears on the gate of transistor 68-1. This pulls the input signal of inverter 60-1 to a low voltage signal. This is inverted once by inverter 60-1 to provide a high voltage signal on the gate of latch transistor 62-1. Thus, transistor 62-1 is on (conductive between its source and drain path) and the input terminal of inverter 60-1 is pulled to and maintained at a low voltage level. The high voltage output signal of inverter 60-1 is inverted once by inverter 64-1 to provide signal $\overline{CLX1}$. This signal is inverted once again by inverter 66-1 to provide signal CLX1. If no signal is provided to bond pad 54-1 the circuitry of FIG. 2 automatically provides the appropriate signal on CLX1 and $\overline{CLX1}$ because inverter 60-1 and transistor 62-1 operate as a logical 0 latch and the input terminal of inverter 60-1 is periodically pulled to ground. Similarly numbered components connected to bond pad 54-2 and bond pad 54-3 operate in a similar manner. Additionally, the circuit comprising inverter 60-1 and transistor 62-1 is designed such that the output signal of inverter 60-1 tends to assume a high voltage state when the external power supply voltage ($V_{dd}$) is applied to the integrated circuit, unless bond pad 54-1 is connected to $V_{dd}$. This causes $\overline{CLX1}$, $\overline{CLB1}$, $\overline{CLB2}$ to assume the proper state even before a transition of $\overline{RAS}$.

FIGS. 3 and 6 are schematic diagrams of the circuitry (furnishing the programming mode refresh signal generator 69) used to generate the CLK refresh signal used in FIG. 2. Signal generator 69 receives as input signals the $\overline{CLX1}$, $\overline{CLB1}$, $\overline{CLB2}$ and row address strobe ($\overline{RAS}$) signals. The $\overline{RAS}$ signal is a commonly used signal in DRAMs. It may be provided to the DRAM or generated on chip. It is selected in this embodiment because it is a signal which undergoes numerous, repetitive transitions. Under normal operation of the integrated circuit, the other three input signals remain stable. Thus, for example, the $\overline{CLX1}$ signal is inverted once by inverter 70-1 and is delayed a certain period of time by delay unit 72-1. Thus a logical 1 and logical 0 are provided to AND gate 74-1 and a logical 0 is provided to OR gate 76. When $\overline{CLB1}$, $\overline{CLB2}$ and $\overline{RAS}$ are also quiescent, all input signals to OR gate 76 are a logical 0 and the CLK signal is a continuous logical 0. If, for example, an erroneous transition occurs on the signal provided on $\overline{CLX1}$ from a logical 0 to a logical 1, a logical 1 is provided directly to the input of AND gate 74-1. A certain amount of time is required for the signal transition to propagate through inverter 70-1 and delay unit 72-1. Thus for a selected period of time, selected by the delay amount of delay unit 72-1 and the propagation delay of inverter 70-1, both input signals to AND gate 74-1 are logical 1 and a logical 1 output signal is provided to the input terminals of OR gate 76. Thus OR gate 76 provides a logical 1 CLK signal. This furnishes the initializing or refreshing high voltage signal described relating to the programming mode circuitry of FIG. 2.

Since $\overline{CLX1}$, $\overline{CLB1}$ and $\overline{CLB2}$ are intended to be stable signals, a transition on any of these indicates that an error event has occurred. If, for example, bond pad 54-1 is unbonded, $\overline{CLX1}$ should be a logical 0. Therefore, a logical 0 to logical 1 transition occurring on $\overline{CLX1}$ indicates that the unbonded bond pad 54-1 has erroneously gone to a high voltage state or some other source of error has occurred, possibly due to electrical noise. In this event, CLK refresh signal pulses to a logical 1 and transistor 68-1 pulls the input signal of inverter 60-1 to its proper state effectively refreshing the states of the circuitry connected to the programming bond pads.

This CLK refresh signal turns on transistors 68-1 through 68-3 of FIG. 2. Thus the inputs of inverters 60-1 through 60-3 of FIG. 2 are biased toward ground through transistors 68-1 through 68-3, both periodically in response to transitions of the $\overline{RAS}$ signal and when an error event is detected on any of the other three input signals to the CLK circuit 69. Those bond pads 54-1 through 54-3 which are not connected to a high voltage signal but which may have erroneously gone to a high voltage state due to electrical noise, will be pulled to a low voltage state and latched at a signal representing a low voltage input signal on the input terminals of inverters 60-1 through 60-3. Those bond pads 54-1 through 54-3 which are connected to $V_{dd}$ will be held up by this connection while CLK pulses to logical 1 and the opposite signal will be provided.

Thus the circuitry allows for the use of a single type of connection between the bond pad and $V_{dd}$ rather than the more complex method requiring two different bonding points providing two different reference voltages. In addition, the described embodiment provides a reliable binary state input mechanism using a single reference voltage.

FIG. 4 is a block diagram showing how the control signals provided by the circuitry of FIG. 2 can select the appropriate signal to be provided to circuitry on the integrated circuit. In this example, multiplexer 78 selects between signal S1 and S2 in response to the signal provided on CLX1 and provides the selected signal as output signal SO. FIG. 5 is a logic diagram showing the pass control of a signal provided by the circuitry of FIG. 2. In this example, the signal provided by CLB1 determines whether the signal provided on SI is passed through to the output of AND gate 80 or whether a logical 0 signal provided on CLB1 locks the output signal of AND gate 80 at a logical 0. Other examples of control of integrated circuit function using the signals provided by the circuitry of FIG. 2 will become obvious to those skilled in the art in light of this specification.

Although a specific embodiments of the present invention are herein described, it is not to be construed as limiting the scope of the invention. The scope of the invention is only limited by the claims appended hereto.

What is claimed is:

1. An electronic device having selectable programmable features comprising:
    A. an integrated circuit carrying plural programming bond pads, said programming bond pads selectably being connected to a reference voltage and remaining programming bond pads unconnected from said reference voltage to indicate said programmable features, said programming bond pads being susceptible to electrical noise that makes an unconnected programming bonding pad appear to be connected to said reference voltage;
    B. programming mode circuitry connected to said plural programming bond pads and sensing the voltage on each said programming bond pad, said mode circuitry producing at least one output signal of one state in response to a respective programming bond pad being sensed to have said reference voltage and of another state in response to said respective programming bond pad being sensed to be unconnected from said reference voltage, said programming mode circuitry refreshing its sensing of the voltage on each said programming bond pad in response to a refresh signal; and
    C. a programming mode refresh signal generator generating a refresh signal to said programming mode circuitry.

2. The electronic device of claim 1 in which said electronic device is a dynamic random access memory.

3. The electronic device of claim 1 in which said mode circuitry includes a latch circuit that latches only in response to said respective programming bond pad being sensed to be unconnected from said reference voltage.

4. The electronic device of claim 3 in which said latch includes an inverter and a latch transistor, said latch transistor having a source to drain path from the input of the inverter to ground and having a gate connected to the output of the inverter, said latch transistor being conductive in its source to drain path upon a high voltage signal on its gate.

5. The electronic device of claim 1 in which said mode circuitry includes an inverter sensing the voltage on each said programming bond pad.

6. The electronic device of claim 1 in which said reference voltage is $V_{dd}$.

7. The electronic device of claim 1 in which said mode circuitry includes a refresh transistor connected to said programming bond pad, said refresh transistor having a source to drain path from said bond pad to ground and having a gate receiving said refresh signal, said refresh transistor being conductive upon a high voltage refresh signal to pull said bond pad to ground.

8. The electronic device of claim 1 in which said signal generator receives at least one input signal and generates said refresh signal in response to a change in state in said input signal.

9. The electronic device of claim 8 in which said signal generator includes a series connection of an inverter, a time delay and an input of an AND gate and said input signal connects to said inverter and another input of said AND gate to produce said refresh signal.

10. The electronic device of claim 8 in which said input signal is said at least one output signal of said mode circuitry.

11. The electronic device of claim 8 in which said input signal is a row address strobe signal.

12. The electronic device of claim 8 in which there are plural input signals that include said at least one output signal and a row address strobe signal, and a change in state of any one of them causing generation of said refresh signal.

13. The electronic device of claim 1 in which said refresh signal generator generates said refresh signal periodically.

14. The electronic device of claim 1 in which said refresh signal generator generates said refresh signal both periodically and when an unconnected bond pad appears to be connected to said reference voltage.

15. A dynamic random access memory having selectable programmable features comprising:
    A. an integrated circuit carrying plural programming bond pads, said programming bond pads selectably being connected to a reference voltage and remaining programming bond pads unconnected from said reference voltage to indicate said programmable features, said programming bond pads being susceptible to electrical noise that makes an unconnected programming bonding pad appear to be connected to said reference voltage;
    B. programming mode circuitry connected to said plural programming bond pads and sensing the voltage on each said programming bond pad, said mode circuitry producing at least one output signal of one state in response to a respective programming bond pad being sensed to have said reference voltage and of another state in response to said respective programming bond pad being sensed to be unconnected from said reference voltage, said programming mode circuitry refreshing its sensing of the voltage on each said programming bond pad in response to a refresh signal; and
    C. a programming mode refresh signal generator receiving said at least one output signal and a row address strobe signal and producing said refresh signal both periodically and in response to a change in said at least one output signal.

16. The electronic device of claim 15 in which said mode circuitry includes a latch circuit that latches only in response to said respective programming bond pad being sensed to be unconnected from said reference voltage.

17. The electronic device of claim 16 in which said latch includes an inverter and a latch transistor, said latch transistor having a source to drain path from the input of the inverter to ground and having a gate connected to the output of the inverter, said latch transistor being conductive in its source to drain path upon a high voltage signal on its gate.

18. The electronic device of claim 15 in which said mode circuitry includes an inverter sensing the voltage on each said programming bond pad.

19. The electronic device of claim 15 in which said reference voltage is $V_{dd}$.

20. The electronic device of claim 15 in which said mode circuitry includes a refresh transistor connected to said programming bond pad, said refresh transistor having a source to drain path from said bond pad to ground and having a gate receiving said refresh signal, said refresh transistor being conductive upon a high voltage refresh signal to pull said bond pad to ground.

21. The electronic device of claim 15 in which said signal generator includes at least one series connection of an inverter, a time delay and an input of an AND gate and said at least one output signal connects to said inverter and another input of said AND gate to produce said refresh signal.

22. The electronic device of claim 21 in which there are a plurality of said series connections, a row address strobe signal connects to one of said inverters and said another input of its respective AND gate, and there are plural output signals each connected to a respective inverter and another input of its respective AND gate.

23. A process of sensing the selected programmable features in an integrated circuit having programming bond pads and a reference voltage, selected programming bond pads connected to said reference voltage and remaining programming bond pads unconnected from said reference voltage, said process comprising:

A. sensing the voltage on each programming bond pad to produce at least one output signal of one state in response to a respective programming bond pad being sensed to have said reference voltage and of another state in response to said respective programming bond pad being sensed to be unconnected from said reference voltage; and B. refreshing said sensing of the voltage on each programming bond pad.

24. The process of claim 23 in which said refreshing includes refreshing periodically.

25. The process of claim 23 in which said refreshing includes refreshing in response to a change in state of said at least one output signal.

26. The process of claim 23 in which said refreshing includes refreshing both periodically and in response to a change in state of said at least one output signal.

27. The process of claim 23 in which said refreshing includes individually connecting said bond pads to ground and said reference voltage is $V_{dd}$.

28. The process of claim 23 in which said sensing includes producing a pair of true and complementary output signals for each bond pad.

29. The process of claim 28 in which said refreshing includes refreshing in response to a change of state of each pair of output signals.

30. The process of claim 23 in which said integrated circuit forms a dynamic random access memory.

31. The process of claim 23 in which said sensing includes sensing with the input of an inverter.

* * * * *